(12) United States Patent
Kato et al.

(10) Patent No.: US 6,388,915 B1
(45) Date of Patent: May 14, 2002

(54) METHOD FOR DRIVING SEMICONDUCTOR MEMORY

(75) Inventors: Yoshihisa Kato, Shiga; Yasuhiro Shimada, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/941,650

(22) Filed: Aug. 30, 2001

(30) Foreign Application Priority Data

Sep. 5, 2000 (JP) ...................................... 2000-268271

(51) Int. Cl.[7] .............................................. G11C 11/22
(52) U.S. Cl. ....................................... 365/145; 365/149
(58) Field of Search ................................ 365/145, 149, 365/230.03

(56) References Cited

U.S. PATENT DOCUMENTS

2001/0021120 A1 * 9/2001 Oowaki ...................... 365/145
2001/0022741 A1 * 9/2001 Takeuchi et al. ............. 365/145
2001/0040814 A1 * 11/2001 Takashima .................. 365/145

* cited by examiner

*Primary Examiner*—Son Mai
(74) *Attorney, Agent, or Firm*—Eric J. Robinson; Nixon Peabody LLP (57) ABSTRACT

A cell selecting transistor serially connected to a data read ferroelectric capacitor selected from plural ferroelectric capacitors for data read is turned on and other cell selecting transistors serially connected to the other ferroelectric capacitors are turned off. Thus, one electrode of the data read ferroelectric capacitor is connected to a set line through a first common node, and the other electrode of the data read ferroelectric capacitor is connected to a load capacitor through a second common node. Next, after a reading voltage is applied to the set line so as to read a data stored in the data read ferroelectric capacitor, the reading voltage applied to the set line is removed. The reading voltage is set to such magnitude that displacement of polarization of the ferroelectric film of the data read ferroelectric capacitor is restored to that obtained before reading a data by removing the reading voltage.

5 Claims, 8 Drawing Sheets

METHOD FOR DRIVING SEMICONDUCTOR MEMORY

BACKGROUND OF THE INVENTION

The present invention relates to a method for driving a semiconductor memory including a ferroelectric capacitor.

Figure 6:
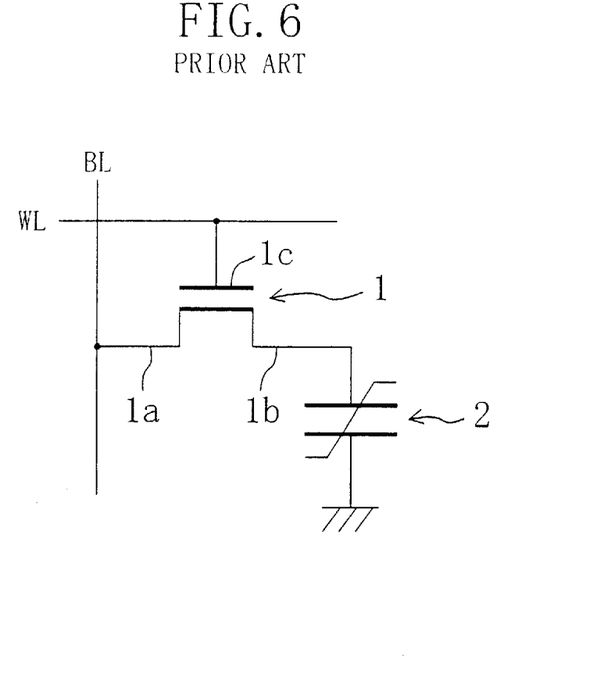
FIG. 6 is an equivalent circuit diagram of a memory cell included in a semiconductor memory according to a first conventional example.

A first known example of a semiconductor memory including a ferroelectric capacitor is composed of, as shown in FIG. 6, a field effect transistor (hereinafter referred to as the FET) 1 and a ferroelectric capacitor 2 with a drain region 1a of the FET 1 connected to a bit line BL, a source region 1b of the FET 1 connected to an upper electrode of the ferroelectric capacitor 2 and a gate electrode 1c of the FET 1 connected to a word line WL.

The semiconductor memory of the first conventional example employs the destructive read-out system in which a recorded data is erased in reading the data. Therefore, it is necessary to carry out a rewrite operation after a data read operation, and hence, an operation for reversing the polarization direction of the ferroelectric film (polarization reversing operation) should be carried out after every data read operation.

Since a phenomenon designated as polarization fatigue occurs in a ferroelectric film, the polarizing characteristic of the ferroelectric film is largely degraded when the polarization reversing operation is repeatedly carried out.

Figure 7:
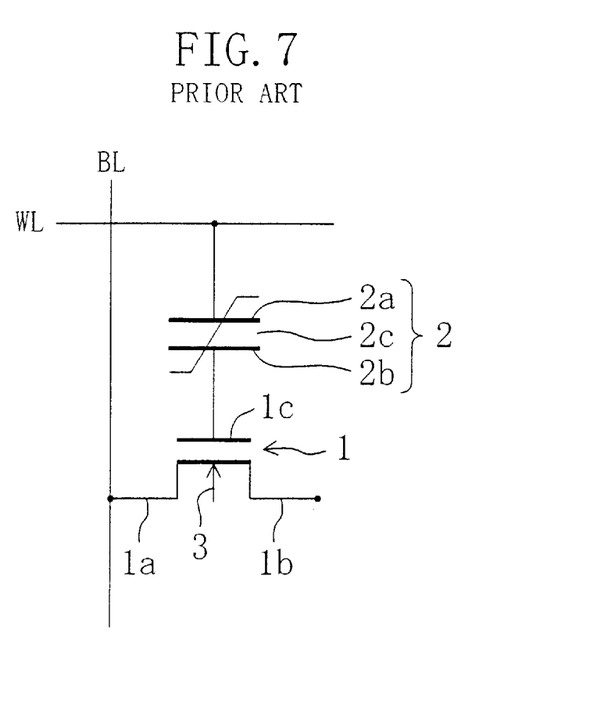
FIG. 7 is an equivalent circuit diagram of a memory cell included in a semiconductor memory according to a second conventional example.

As a countermeasure, a semiconductor memory of a second conventional example as shown in FIG. 7 has been proposed. Specifically, the semiconductor memory of the second conventional example employs the non-destructive read-out system in which a lower electrode 2b of a ferroelectric capacitor 2 is connected to a gate electrode 1c of an FET 1 so as to use the ferroelectric capacitor 2 for controlling the gate potential of an FET 1. In FIG. 7, a reference numeral 3 denotes a substrate.

In writing a data in the semiconductor memory of the second conventional example, a writing voltage is applied between an upper electrode 2a of the ferroelectric capacitor 2 working as the control gate and the substrate 3.

For example, when a data is written by applying a voltage (control voltage) positive with respect to the substrate 3 to the upper electrode 2a, downward polarization is caused in a ferroelectric film 2c of the ferroelectric capacitor 2. Thereafter, even when the upper electrode 2a is grounded, positive charge remains in the gate electrode 1c of the FET 1, and hence, the gate electrode 1c has a positive potential.

When the potential of the gate electrode 1c exceeds the threshold voltage of the FET 1, the FET 1 is in an on-state. Therefore, when a potential difference is caused between a drain region 1a and a source region 1b of the FET 1, a current flows between the drain region 1a and the source region 1b. Such a logical state of the ferroelectric memory is defined, for example, as "1".

On the other hand, when a voltage negative with respect to the substrate 3 is applied to the upper electrode 2a of the ferroelectric capacitor 2, upward polarization is caused in the ferroelectric film 2c of the ferroelectric capacitor 2. Thereafter, even when the upper electrode 2a is grounded, negative charge remains in the gate electrode 1c of the FET 1, and hence, the gate electrode 1c has a negative potential. In this case, the potential of the gate electrode 1c is always lower than the threshold voltage of the FET 1, and hence, the FET 1 is in an off-state. Therefore, even when a potential difference is caused between the drain region 1a and the source region 1b of the FET 1, no current flows between the drain region 1a and the source region 1b. Such a logical state of the ferroelectric memory is defined, for example, as "0".

Even when the power supply to the ferroelectric capacitor 2 is shut off, namely, even when the voltage application to the upper electrode 2a of the ferroelectric capacitor 2 is stopped, the aforementioned logical states are retained, and thus, a nonvolatile memory is realized. Specifically, when power is supplied again to apply a voltage between the drain region 1a and the source region 1c after shutting off the power supply for a given period of time, a current flows between the drain region 1a and the source region 1b if the logical state is "1", so that the data "1" can be read, and no current flows between the drain region 1a and the source region 1b if the logical state is "0", so that the data "0" can be read.

In order to correctly retain a data while the power is being shut off (which characteristic for retaining a data is designated as retention), it is necessary to always keep the potential of the gate electrode 1c of the FET 1 to be higher than the threshold voltage of the FET 1 when the data is "1" and to always keep the potential of the gate electrode 1c of the FET 1 at a negative voltage when the data is "0".

Figure 8:
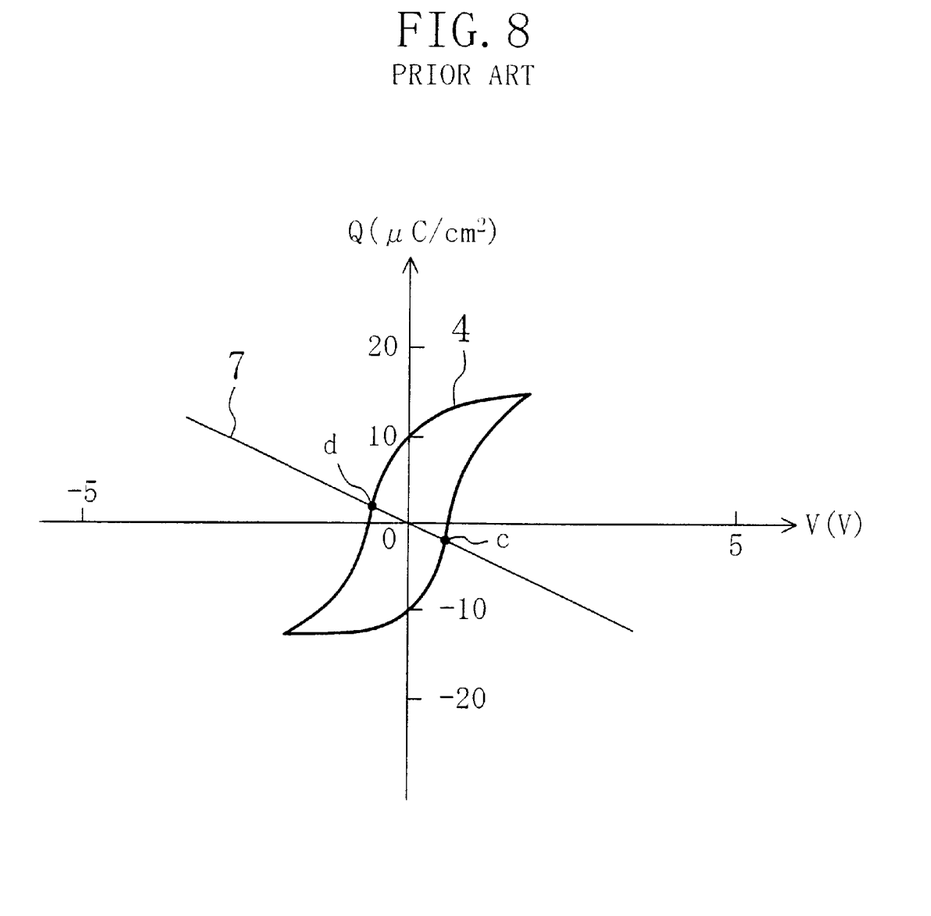
FIG. 8 is a diagram for explaining behavior of charge and voltage in a read operation of the semiconductor memory of the second conventional example.

While the power is being shut off, the upper electrode 2a of the ferroelectric capacitor 2 and the substrate 3 have a ground potential, and hence, the potential of the gate electrode 1c is isolated. Therefore, ideally, as shown in FIG. 8, a first intersection c between a hysteresis loop 4 obtained in writing a data in the ferroelectric capacitor 2 and a gate capacitance load line 7 of the FET 1 obtained when a bias voltage is 0 V corresponds to the potential of the gate electrode 1c obtained in storing a data "1", and a second intersection d between the hysteresis loop 4 and the gate capacitance load line 7 corresponds to the potential of the gate electrode 1c obtained in storing a data "0". In FIG. 8, the ordinate indicates charge Q appearing in the upper electrode 2a (or the gate electrode 1c) and the abscissa indicates voltage V.

Actually, however, the ferroelectric capacitor 2 is not an ideal insulator but has a resistance component, and hence, the potential of the gate electrode 1c drops through the resistance component. This potential drop is exponential and has a time constant obtained by multiplying parallel combined capacitance of the gate capacitance of the FET 1 and the capacitance of the ferroelectric capacitor 2 by the resistance component of the ferroelectric capacitor 2. The time constant is approximately $10^4$ seconds at most. Accordingly, the potential of the gate electrode 1c is halved within several hours.

Since the potential of the gate electrode 1c is approximately 1 V at the first intersection c as shown in FIG. 8, when the potential is halved, the potential of the gate electrode 1c becomes approximately 0.5 V, which is lower than the threshold voltage of the FET 1 (generally of approximately 0.7 V). As a result, the FET 1 that should be in an on-state is turned off in a short period of time.

In this manner, although the ferroelectric memory using the ferroelectric capacitor for controlling the gate potential of the FET has an advantage that a rewrite operation is not necessary after a data read operation, it has the following problem: The gate electrode of the FET obtains a potential after writing a data, and the ability for keeping the gate potential determines the retention characteristic. Since the time constant until discharge of the ferroelectric capacitor is short due to the resistance component of the ferroelectric capacitor, the data retaining ability is short, namely, the retention characteristic is not good.

Figure 9:
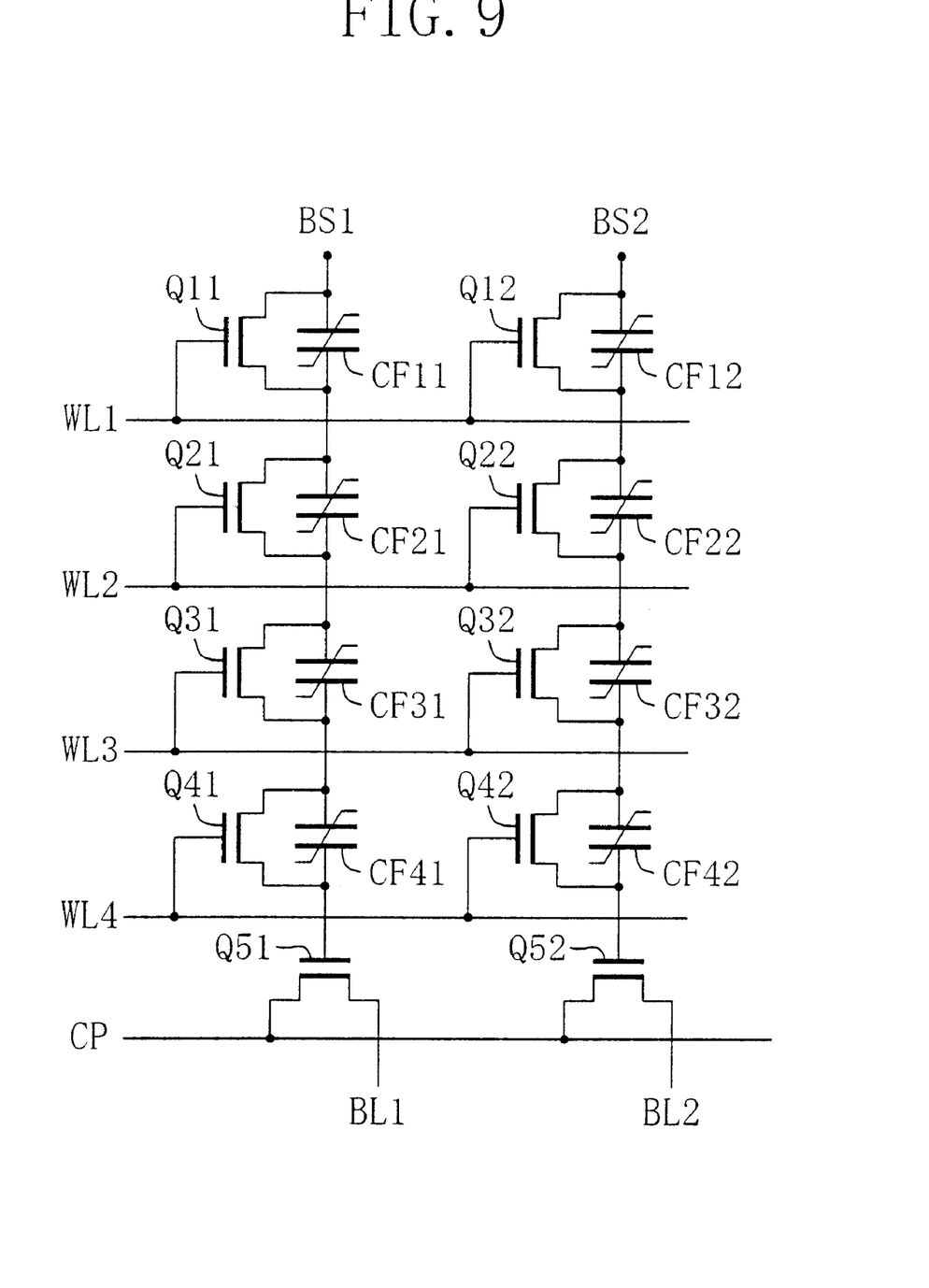
FIG. 9 is an equivalent circuit diagram of a semiconductor memory set forth as a premise of the invention.

For overcoming this problem, the present inventors have considered a semiconductor memory as shown in FIG. 9. Hereinafter, the semiconductor memory of FIG. 9 set forth as a premise of the invention is designated as a premise semiconductor memory.

In a memory cell block in the first column of the premise semiconductor memory, a plurality of ferroelectric capacitors, for example, four ferroelectric capacitors CF11, CF21, CF31 and CF41 are serially connected to one another in a bit line direction, and the ferroelectric capacitors CF11, CF21, CF31 and CF41 are respectively connected to selecting field effect transistors (hereinafter simply referred to as the selecting transistors) Q11, Q21, Q31 and Q41 in parallel. Thus, each of the ferroelectric capacitor and a corresponding one of the selecting transistors together form a memory cell. To a lower end of a series circuit in the first column including the serially connected plural ferroelectric capacitors CF11, CF21, CF31 and CF41, a first reading field effect transistor (hereinafter simply referred to as the reading transistor) Q51 is connected for reading a data by detecting displacement of the polarization of a ferroelectric film of a ferroelectric capacitor selected from the plural ferroelectric capacitors CF11, CF21, CF31 and CF41.

Also, in a memory cell block in the second column, similarly to the first memory cell block, a plurality of ferroelectric capacitors CF12, CF22, CF32 and CF42 are serially connected to one another in the bit line direction, and the ferroelectric capacitors CF12, CF22, CF32 and CF42 are respectively connected to selecting transistors Q12, Q22, Q32 and Q42 in parallel. To a lower end of a series circuit in the second column including the plural serially connected ferroelectric capacitors CF12, CF22, CF32 and CF42, a second reading transistor Q52 is connected for reading a data by detecting displacement of the polarization of a ferroelectric film of a selected ferroelectric capacitor.

The gate electrodes of the selecting transistors Q11 and Q12 included in the memory cells disposed on the first row are connected to a first word line WL1, the gate electrodes of the selecting transistors Q21 and Q22 included in the memory cells disposed on the second row are connected to a second word line WL2, the gate electrodes of the selecting transistors Q31 and Q32 included in the memory cells disposed on the third row are connected to a third word line WL3, and the gate electrodes of the selecting transistors Q41 and Q42 included in the memory cells disposed on the fourth row are connected to a fourth word line WL4.

An upper end of the series circuit in the first column, namely, the upper electrode of the ferroelectric capacitor CF11 disposed on the first row, is connected to a first control line (first set line) BS1, the lower end of the series circuit in the first column, namely, the lower electrode of the ferroelectric capacitor CF41 disposed on the fourth row, is connected to the gate electrode of the first reading transistor Q51, and the drain region of the first reading transistor Q51 is connected to a first bit line BL1.

An upper end of the series circuit in the second column, namely, the upper electrode of the ferroelectric capacitor CF12 disposed on the first row, is connected to a second control line (second set line) BS2, the lower end of the series circuit in the second column, namely, the lower electrode of the ferroelectric capacitor CF42 disposed on the fourth row, is connected to the gate electrode of the second reading transistor Q52, and the drain region of the second reading transistor Q52 is connected to a second bit line BL2.

The source region of the first reading transistor Q51 and the source region of the second reading transistor Q52 are connected to a plate line (reset line) CP.

A write operation of the premise semiconductor memory will now be described. In the following description, a data is written in, for example, the ferroelectric capacitor CF21 included in the memory cell disposed in the first column and on the second row.

First, a high voltage is applied to the word lines WL1, WL3 and WL4 so as to turn on the selecting transistors Q11, Q31 and Q41, and a ground voltage is applied to the word line WL2 so as to turn off the selecting transistor Q21. In this manner, the ferroelectric capacitor CF21 is selected, and the capacitance of the ferroelectric capacitor CF21 and the gate capacitance of the first reading transistor Q51 are serially connected to each other. Therefore, one end of the series capacitance circuit is connected to the well region of the first reading transistor Q51 and the other end of the series capacitance circuit is connected to the first control line BS1.

Next, when the well region of the first reading transistor Q51 is grounded and a writing voltage is applied to the first control line BS1, the polarization direction of the ferroelectric capacitor CF21 is changed in accordance with the polarity of the writing voltage. Thereafter, when a high voltage is applied to the word line WL2 so as to turn on the selecting transistor Q21, the upper electrode and the lower electrode of the ferroelectric capacitor CF21 are short-circuited, resulting in resetting the ferroelectric capacitor CF21.

A read operation for reading a data from the ferroelectric capacitor CF21 included in the memory cell disposed in the first column and on the second row is carried out as follows:

First, in the same manner as in a write operation, a high voltage is applied to the word lines WL1, WL3 and WL4 so as to turn on the selecting transistors Q11, Q31 and Q41, and a ground voltage is applied to the word line WL2 so as to turn off the selecting transistor Q21. Thus, the ferroelectric capacitor CF21 is selected, and the capacitance of the ferroelectric capacitor CF21 and the gate capacitance of the first reading transistor Q51 are serially connected to each other. Therefore, one end of the series capacitance circuit is connected to the well region of the first reading transistor Q51 and the other end is connected to the first control line BS1.

Next, the well region of the first reading transistor Q51 is grounded and a reading voltage is applied to the first control line BS1. Thus, a voltage obtained by dividing the reading voltage in accordance with a capacitance ratio between the capacitance of the ferroelectric capacitor CF21 and the gate capacitance of -the first reading transistor Q51 is applied to the gate electrode of the first reading transistor Q51, a current flows between the drain region and the source region of the first reading transistor Q51 in accordance with the potential of the gate electrode thereof, and the current flows between the plate line CP and the first bit line BL1.

In the premise semiconductor memory, the polarization value of a ferroelectric film is different depending upon a data written in a ferroelectric capacitor including the ferroelectric film, and hence, the change of the polarization value of the ferroelectric film caused in applying a reading voltage is also different depending upon the data. Since a ratio of the change of a polarization value to the change of a voltage corresponds to capacitance, the capacitance of a ferroelectric capacitor is different depending upon the polarization value of a ferroelectric film corresponding to a written data. In other words, the capacitance of the selected ferroelectric capacitor CF21 has a different value depending upon the polarization value of the ferroelectric film of the ferroelectric capacitor CF21.

The gate voltage of the first reading transistor Q51 is determined on the basis of capacitance division between the capacitance of the ferroelectric capacitor CF21 and the gate capacitance of the first reading transistor Q51. Therefore, the gate capacitance of the first reading transistor Q51 is changed depending upon the polarization value of the ferroelectric film of the ferroelectric capacitor CF21.

Accordingly, in accordance with a data written in the ferroelectric capacitor CF21, a value of a current flowing between the source region and the drain region of the first reading transistor Q51 is changed. When this change of the current value is detected, the data written in the ferroelectric capacitor CF21 can be read.

As described above, in the premise semiconductor memory, the ferroelectric capacitor is reset after writing a data therein, and hence, no voltage is applied to the ferroelectric capacitor during data retention time. Therefore, this semiconductor memory has a good retention characteristic. Specifically, the premise semiconductor memory can attain a good retention characteristic by retaining the polarization state of a ferroelectric film instead of retaining a potential difference caused in a ferroelectric capacitor.

In the premise semiconductor memory, however, parasitic capacitances between the respective ferroelectric capacitors and the reading transistor are different depending upon the addresses of the ferroelectric capacitors. For example, when the parasitic capacitance present between the ferroelectric capacitor CF41 on the fourth row and the first reading transistor Q51 is assumed to be $q_1$ and the parasitic capacitance of each of the selecting transistors Q11, Q21, Q31 and Q41 is assumed to be $q_2$, the parasitic capacitance present in reading a data from the ferroelectric capacitor CF41 on the fourth row is $q_1$ while the parasitic capacitance present in reading a data from the ferroelectric capacitor CF11 on the first row is $q_1+3\times q_2$.

Since the parasitic capacitances present between the respective ferroelectric capacitors and the reading transistor are thus different depending upon the addresses, the gate voltage of the reading transistor is varied depending upon the address of a ferroelectric capacitor to be read in a read operation. This disadvantageously makes the operation of the reading transistor unstable.

SUMMARY OF THE INVENTION

In consideration of the aforementioned conventional problems, an object of the invention is improving the retention characteristic of a semiconductor memory and stabilizing the operation of a reading transistor.

In order to achieve the object, the method for driving a semiconductor memory of this invention is employed in a semiconductor memory including a memory cell block composed of a plurality of memory cells connected to one another in parallel and each including a ferroelectric capacitor for storing a data in accordance with displacement of polarization of a ferroelectric film thereof and a cell selecting transistor connected to the ferroelectric capacitor in series; a set line connected to a first common node of two common nodes included in the memory cell block, a reading voltage being applied to the set line; and a load capacitor connected to a second common node of the two common nodes for detecting displacement of polarization of the ferroelectric film of a selected ferroelectric capacitor selected from a plurality of ferroelectric capacitors included in the plurality of memory cells, and the method comprises a first step of turning on one of the cell selecting transistors serially connected to the data read ferroelectric capacitor and turning off the other of the cell selecting transistors serially connected to ferroelectric capacitors from which a data is not to be read among the plurality of ferroelectric capacitors, whereby connecting a first electrode of the data read ferroelectric capacitor to the set line through the first common node and connecting a second electrode of the data read ferroelectric capacitor to the load capacitor through the second common node; a second step of applying a reading voltage to the set line; and a third step of removing the reading voltage applied to the set line, and the reading voltage applied in the second step is set to such magnitude that displacement of polarization of the ferroelectric film of the data read ferroelectric capacitor is restored to displacement obtained before reading a data by removing the reading voltage in the third step.

In the method for driving a semiconductor memory of this invention, the reading voltage applied in the second step is set to such magnitude that the displacement of the polarization of the ferroelectric film is restored to that obtained before reading a multi-valued data by removing the reading voltage in the third step. Therefore, when a data stored in the ferroelectric capacitor is read, the read data is not destroyed, and hence, there is no need to carry out a data rewrite operation. Accordingly, since there is no need to carry out an operation for reversing the polarization direction of the ferroelectric film (polarization reversing operation) after every data read operation, polarization fatigue is minimally caused in the ferroelectric film of the ferroelectric capacitor. As a result, the readable number of a semiconductor memory can be largely improved.

Also, in reading a data by moving charge from the data read ferroelectric capacitor to the load capacitor, the other ferroelectric capacitors not selected are disconnected from the load capacitor by the cell selecting transistors placed in an off-state. Therefore, since the unselected ferroelectric capacitors do not work as parasitic capacitance, a voltage applied to the load capacitor in reading a data can be prevented from varying.

The method for driving a semiconductor memory preferably further comprises, after the third step, a fourth step of making a potential difference caused between the first electrode and the second electrode of the data read ferroelectric capacitor zero.

When the potential difference caused between the first electrode and the second electrode of the ferroelectric capacitor is made zero after the third step, potential lowering through a resistance component of the ferroelectric capacitor can be suppressed, resulting in improving the retention characteristic.

In the method for driving a semiconductor memory, the reading voltage applied in the second step is preferably set to such magnitude that a potential difference caused, in applying the reading voltage, between the first electrode and the second electrode of the data read ferroelectric capacitor is smaller than a coercive voltage of the data read ferroelectric capacitor.

By setting the reading voltage to such magnitude, the displacement of the polarization of the ferroelectric film of the data read ferroelectric capacitor can be definitely restored to that obtained before reading the data when the reading voltage applied in the second step is removed.

In the method for driving a semiconductor memory, it is preferred that the plurality of ferroelectric capacitors are disposed on the side of the first common node and that the plurality of cell selecting transistors are disposed on the side of the second common node.

When the ferroelectric capacitors and the cell selecting transistors are thus disposed, as compared with the case where the cell selecting transistors are respectively disposed between the first common node and the ferroelectric capacitors, parasitic capacitance connected to the second common node can be lowered. As a result, a read operation can be carried out more stably.

In the method for driving a semiconductor memory, the load capacitor is preferably a field effect transistor whose gate electrode is connected to the second common node.

In this case, the voltage applied in the second step can be divided in accordance with a capacitance ratio between the capacitance of the ferroelectric capacitor and the gate capacitance of the field effect transistor. Therefore, the voltage applied to the ferroelectric capacitor can be easily set to such magnitude that the displacement of the polarization of the ferroelectric film is restored to that obtained before reading a data. Furthermore, the displacement of the polarization of the ferroelectric film can be definitely detected by detecting a current flowing between the drain region and the source region of the field effect transistor.

DETAILED DESCRIPTION OF THE INVENTION

Embodiment 1

A semiconductor memory and a method for driving the same according to Embodiment 1 of the invention will now be described with reference to FIG. 1.

Figure 1:
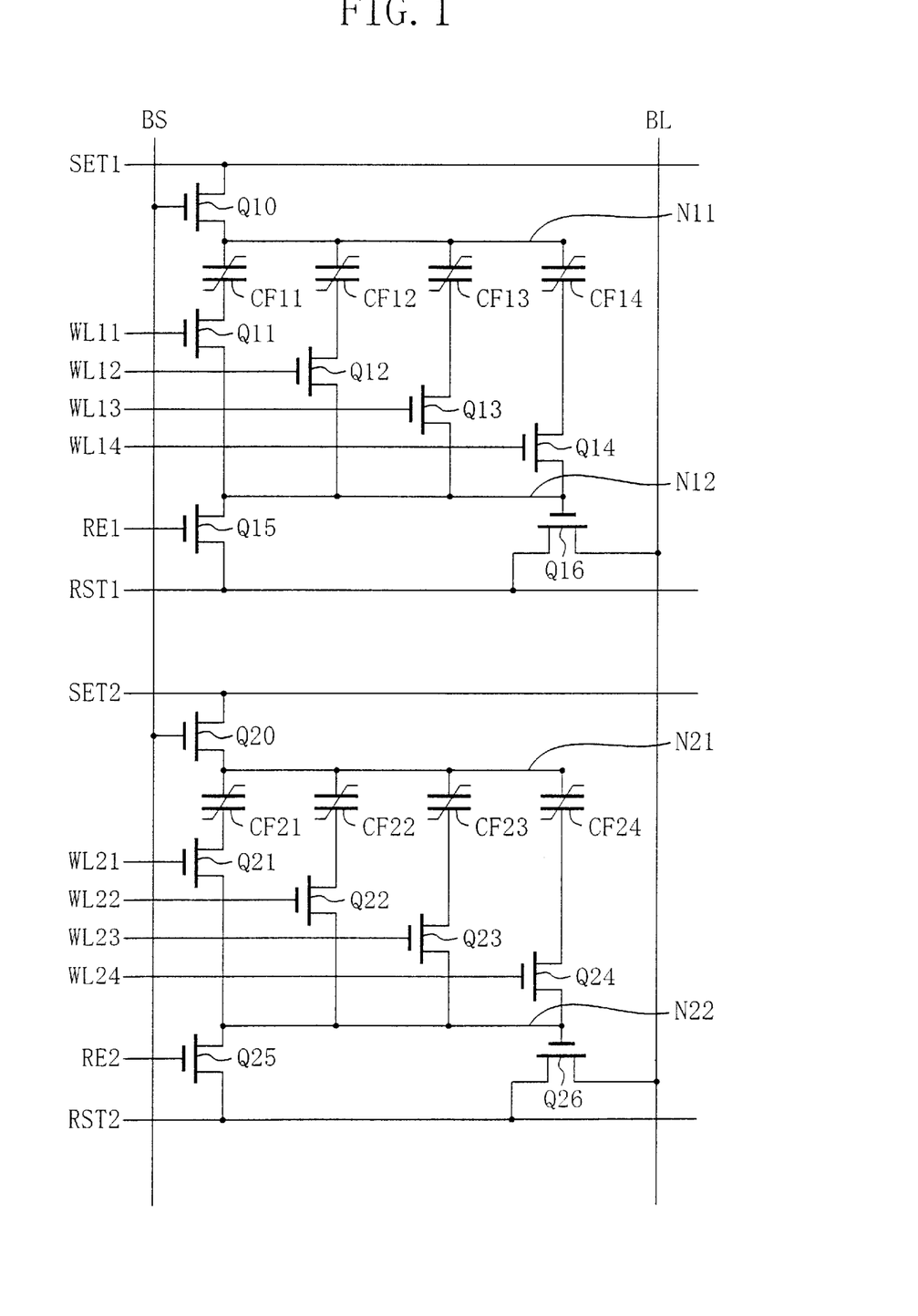
FIG. 1 is an equivalent circuit diagram of first and second memory cell blocks included in a semiconductor memory according to Embodiment 1 of the invention.

FIG. 1 is an equivalent circuit diagram of first and second memory cell blocks included in the semiconductor memory of Embodiment 1.

As shown in FIG. 1, in the first memory cell block, a plurality of ferroelectric capacitors CF11, CF12, CF13 and CF14 each for storing a data in accordance with displacement of polarization of a ferroelectric film thereof are respectively connected to a plurality of cell selecting field effect transistors (hereinafter simply referred to as the cell selecting transistors) Q11, Q12, Q13 and Q14 in series, so that a plurality of memory cells each composed of each of the ferroelectric capacitors and a corresponding one of the cell selecting transistors can be connected to one another in parallel.

A first common node N11 of the first memory cell block is connected through a first memory cell block selecting field effect transistor (hereinafter simply referred to as the first block selecting transistor) Q10 for selecting the first memory cell block to a first set line SET1 to which a reading voltage is applied. The gate electrode of the first block selecting transistor Q10 is connected to a block selecting line BS. A second common node N12 is connected to a first reset line RST1 through a first writing field effect transistor (hereinafter simply referred to as the first writing transistor) Q15 and also to the gate electrode of a first reading field effect transistor (hereinafter simply referred to as the first reading transistor) Q16 serving as a load capacitor. The gate electrode of the first writing transistor Q15 is connected to a first writing transistor control line RE1, the drain region of the first reading transistor Q16 is connected to a bit line BL, and the source region of the first reading transistor Q16 is connected to the first reset line RST1.

The gate electrodes of the cell selecting transistors Q11, Q12, Q13 and Q14 are respectively connected to word lines WL11, WL12, WL13 and WL14.

Also in the second memory cell block, a plurality of ferroelectric capacitors CF21, CF22, CF23 and CF24 each for storing a data in accordance with displacement of polarization of a ferroelectric film thereof are respectively connected to a plurality of cell selecting transistors Q21, Q22, Q23 and Q24 in series, so that a plurality of memory cells each composed of each of the ferroelectric capacitors and a corresponding one of the cell selecting transistors can be connected to one another in parallel.

A first common node N21 of the second memory cell block is connected through a second memory cell block selecting field effect transistor (hereinafter simply referred to as the second block selecting transistor) Q20 for selecting the second memory cell block to a second set line SET2 to which a reading voltage is applied. The gate electrode of the second block selecting transistor Q20 is connected to the block selecting line BS. A second common node N22 is connected to a second reset line RST2 through a second writing field effect transistor (hereinafter simply referred to as the second writing transistor) Q25 and also to the gate electrode of a second reading field effect transistor (hereinafter simply referred to as the second reading transistor) Q26 serving as a load capacitor. The gate electrode of the second writing transistor Q25 is connected to a second writing transistor control line RE2, the drain region of the second reading transistor Q26 is connected to the bit line BL and the source region of the second reading transistor Q26 is connected to the second reset line RST2.

The gate electrodes of the cell selecting transistors Q21, Q22, Q23 and Q24 are respectively connected to word lines WL21, WL22, WL23 and WL24.

As a characteristic of Embodiment 1, the ferroelectric capacitors CF11, CF12, CF13 and CF14 are disposed on the side of the first common node N11 and the cell selecting transistors Q11, Q12, Q13 and Q14 are disposed on the side of the second common node N12 in the first memory cell block, and the ferroelectric capacitors CF21, CF22, CF23 and CF24 are disposed on the side of the first common node N21 and the cell selecting transistors Q21, Q22, Q23 and Q24 are disposed on the side of the second common node N22 in the second memory cell block.

The plural ferroelectric capacitors CF11, CF12, CF13, CF14, CF21, CF22, CF23 and CF24 included in the first and second memory cell blocks have the same capacitance, and the plural cell selecting transistors Q11, Q12, Q13, Q14, Q21, Q22, Q23 and Q24 have the same size.

Although not shown in FIG. 1, the bit line BL is connected to a sense amplifier SA to which a reference voltage VREF is input, so that voltage change appearing on the bit line BL can be compared with the reference voltage VREF by the sense amplifier SA. Thus, a data stored in a selected ferroelectric capacitor can be read.

(Data Write Operation)

A data write operation of the semiconductor memory of Embodiment 1 will now be described. In the following description, a data is written in, for example, the ferroelectric capacitor CF12 included in the memory cell in the second column of the first memory cell block.

First, a high signal is applied to the block selecting line BS, the first writing transistor control line RE1 and the word line WL12 so as to turn on the first block selecting transistor Q10, the first writing transistor Q15 and the cell selecting transistor Q12. Also, a low signal is applied to the second writing transistor control line RE2 and the word lines WL11, WL13, WL14, WL21, WL22, WL23 and WL24 so as to turn off the second writing transistor Q25 and the cell selecting transistors Q11, Q13, Q14, Q21, Q22, Q23 and Q24.

Thus, the memory cell in the second column of the first memory cell block is selected.

Next, in writing a data "1", a high signal is applied to the first set line SET1 and a low signal is applied to the first reset line RST1, and in writing a data "0", a low signal is applied to the first set line SET1 and a high signal is applied to the first reset line RST1.

Thus, a set voltage is applied to the upper electrode of the ferroelectric capacitor CF12 included in the memory cell in the second column of the first memory cell block and a reset voltage is applied to the lower electrode of the ferroelectric capacitor CF12. Therefore, in writing a data "1", downward polarization is caused in the ferroelectric film of the ferroelectric capacitor CF12, and in writing a data "0", upward polarization is caused in the ferroelectric film of the ferroelectric capacitor CF12.

Then, when the data write operation is completed, after equalizing the potentials of the first set line SET1 and the first reset line RST1, a low signal is applied to the block selecting line BS, the first writing transistor control line RE1 and the word line WL12, so as to turn off the first block selecting transistor Q10, the first writing transistor Q15 and the cell selecting transistor Q12.

In this manner, a potential difference caused between the upper electrode and the lower electrode of the ferroelectric capacitor CF12 is made zero. Therefore, when the power is shut off under this condition, the polarization of the ferroelectric film of the ferroelectric capacitor CF12 can be retained, so that the data written in the ferroelectric capacitor CF12 can be retained. In this manner, the semiconductor memory exhibits the function as a nonvolatile memory.

(Data Read Operation)

An operation for reading a data from the ferroelectric capacitor CF12 included in the memory cell in the second column of the first memory cell block will now be described.

First, a high signal is applied to the block selecting line BS and the word line WL12 so as to turn on the first block selecting transistor Q10 and the cell selecting transistor Q12. Also, a low signal is applied to the first writing transistor control line RE1 and the word lines WL11, WL13, WL14, WL21, WL22, WL23 and WL24 so as to turn off the first writing transistor Q15 and the cell selecting transistors Q11, Q13, Q14, Q21, Q22, Q23 and Q24. Furthermore, a high signal is applied to the second writing transistor control line RE2 so as to turn on the second writing transistor Q25.

Thus, the first set line SET1 is connected to the upper electrode of the ferroelectric capacitor CF12 and the lower electrode of the ferroelectric capacitor CF12 is connected to the gate electrode of the first reading transistor Q16. The other ferroelectric capacitors CF11, CF13 and CF14 of the first memory cell block are disconnected from the first reading transistor Q16 and the ferroelectric capacitors CF21, CF22, CF23 and CF24 of the second memory cell block are disconnected from the second reading transistor Q26.

Under this condition, when a reading voltage (of, for example, 1.5 V) is applied to the first set line SET1, a voltage obtained by dividing the reading voltage in accordance with a capacitance ratio between the capacitance of the ferroelectric capacitor CF12 and the gate capacitance of the first reading transistor Q16 is applied to the gate electrode of the first reading transistor Q16.

Since the polarization direction of the ferroelectric film of the ferroelectric capacitor CF12 is different between the case where the ferroelectric capacitor CF12 stores a data "1" and the case where it stores a data "0", the shape of a hysteresis line is different, and hence, the magnitude of a voltage applied to the gate electrode of the first reading transistor Q16 is different between these cases. Accordingly, the gate potential of the first reading transistor Q16 is different in accordance with the stored data. This will now be described with reference to FIG. 2.

Figure 2:
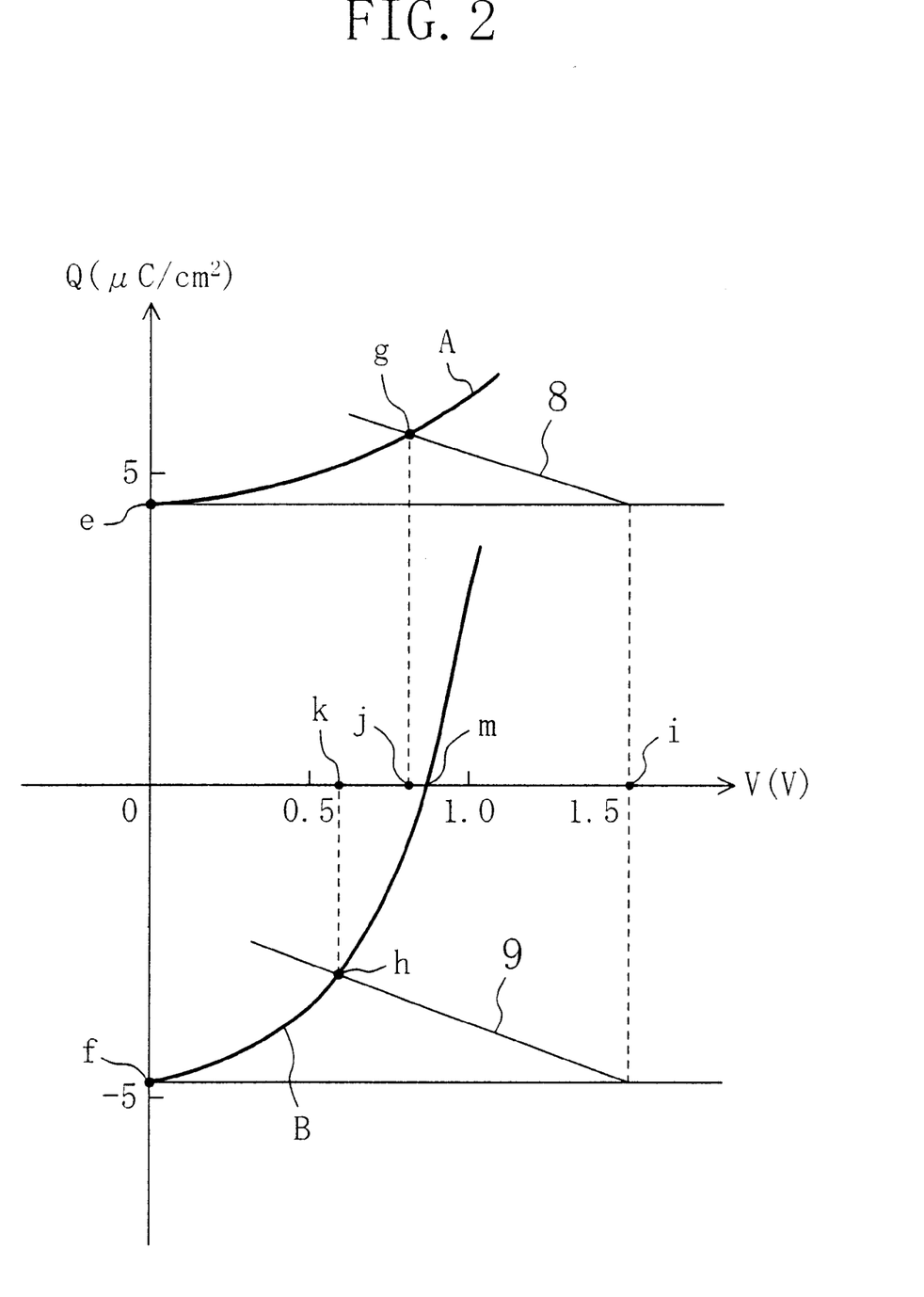
FIG. 2 is a diagram for explaining behavior of charge and voltage in a read operation of the semiconductor memory of Embodiment 1.

In assuming a point for keeping the polarization to be the origin and the gate capacitance to be a load line, a state where a reading voltage of 1.5 V is applied to the first set line SET1 is equivalent to the load line crossing the voltage axis (abscissa) at a point of 1.5 V. This is equivalent to giving a first gate capacitance load line 8 with respect to a data "1" and giving a second gate capacitance load line 9 with respect to a data "0" as shown in FIG. 2.

When a voltage is applied to the first set line SET1, a voltage is also applied to the ferroelectric capacitor CF12. Therefore, in the case where the first set line SET1 has a potential of 1.5 V, the polarization is changed along a first curve A when the data is "1" so as to be balanced at an intersection g between the first curve A and the first gate capacitance load line 8, and the polarization is changed along a second curve B when the data is "0" so as to be balanced at an intersection h between the second curve B and the second gate capacitance load line 9.

Intersections i, j and k determine the distribution of the potential in the respective polarized states. When the stored data is "1", a voltage of approximately 0.7 V between the intersection i and the intersection j is distributed as the gate potential of the first reading transistor Q16, and when the stored data is "0", a voltage of approximately 0.9 V between the intersection i and the intersection k is distributed as the gate potential of the first reading transistor Q16.

Accordingly, when the threshold voltage of the first reading transistor Q16 is set to 0.8 V corresponding to an intermediate value between 0.7 V and 0.9 V, the first reading transistor Q16 is in an off-state in reading a data "1" and is in an on-state in reading a data "0".

Therefore, when a potential difference is induced between the bit line BL and the first reset line RST1 of FIG. 1, no current flows through the first reading transistor Q16 when a data "1" is stored and a current flows through the first reading transistor Q16 when a data "0" is stored. Accordingly, it can be determined whether the stored data is "1" or "0" by detecting a current flowing through the first reading transistor Q16 with the sense amplifier SA.

In this read operation, when the stored data is "1", the application of the reading voltage to the first set line SET1 enhances the polarization but when the stored data is "0", the voltage application partially reverses the polarization. Accordingly, if a voltage applied to the ferroelectric capacitor CF12 exceeds the coercive voltage thereof, the polarization is reversed. However, in this embodiment, the voltage applied to the ferroelectric capacitor CF12 when the stored data is "0" is 0.6 V, which is lower than a point m corresponding to the coercive voltage. Therefore, the polarization is not reversed and there is no fear of change of a stored data.

At this point, the voltage applied between the first set line SET1 and the substrate of the first reading transistor Q16 is preferably distributed between a voltage applied between the upper electrode and the lower electrode of the ferroelectric capacitor CF12 and a voltage applied between the gate electrode and the substrate of the first reading transistor Q16 by adjusting the capacitance of the ferroelectric capacitor CF12 and the gate capacitance of the first reading transistor Q16, so that the voltage applied to the ferroelectric capacitor CF12 can be set to a voltage not exceeding the coercive voltage thereof, namely, a voltage not reversing the polarization.

In Embodiment 1, the voltage applied to the ferroelectric capacitor CF12 in a read operation is set to a voltage not exceeding the coercive voltage of the ferroelectric capacitor CF12, which does not limit the invention. The voltage may be set to such magnitude that the displacement of the polarization of the ferroelectric film of the ferroelectric capacitor CF12 can be restored to that obtained before reading the data by removing the reading voltage applied to the ferroelectric capacitor CF12.

When the voltage is set to such magnitude, the polarization of the ferroelectric film of the ferroelectric capacitor CF12 is not reversed in a read operation, and hence, there is no need to carry out an operation for reversing the polarization direction of the ferroelectric film (a polarization reversing operation) after every data read operation. Accordingly, polarization fatigue is minimally caused in the ferroelectric film of the ferroelectric capacitor CF12, resulting in largely improving the retention characteristic of the semiconductor memory.

When the data read operation is completed, a low signal is applied to the first set line SET1 and the first reset line RST1, so as to make a potential difference caused between the upper electrode and the lower electrode of the ferroelectric capacitor CF12 zero.

Next, a high signal is applied to the first writing transistor control line RE1 so as to turn on the first writing transistor Q15. Thereafter, a low signal is applied to the block selecting line BS and the word line WL2 so as to turn off the first block selecting transistor Q10 and the cell selecting transistor Q12.

During the read operation, the gate potential of the first reading transistor Q16 that is a floating node is varied due to a leakage current through the ferroelectric capacitor CF12 and the cell selecting transistor Q12, and the floating node is thus reset.

In Embodiment 1, the ferroelectric capacitors CF11, CF12, CF13 and CF14 have the same capacitance and the cell selecting transistors Q11, Q12, Q13 and Q14 have the same size, and hence, parasitic capacitances present between the respective ferroelectric capacitors CF11, CF12, CF13 and CF14 and the first reading transistor Q16 are the same.

Therefore, the problem of variation of the gate potential of the first reading transistor Q16 depending upon the address of the ferroelectric capacitor to be read can be avoided.

Specifically, the cell selecting transistors Q11, Q12, Q13 and Q14 are respectively connected between the ferroelectric capacitors CF11, CF12, CF13 and CF14 and the first reading transistor Q16 in the first memory cell block. Therefore, in reading a data by moving charge from the ferroelectric capacitor CF12 included in the selected memory cell to the gate electrode of the first reading transistor Q16, the ferroelectric capacitors CF11, CF13 and CF14 included in the unselected memory cells are disconnected from the first reading transistor Q16 by the cell selecting transistors Q11, Q13 and Q14 placed in an off-state. Accordingly, the ferroelectric capacitors CF11, CF13 and CF14 included in the unselected memory cells and having large capacitance do not work as parasitic capacitance, resulting in preventing variation of the operation voltage of the first reading transistor Q16.

During the read operation, the gate electrode of the second reading transistor Q26 is connected to the second reset line RST2 through the second writing transistor Q25, and the second reading transistor Q26 can be definitely placed in an off-state by grounding the second reset line RST2. As a result, a data read operation can be stably carried out in the first memory cell block.

Embodiment 2

A semiconductor memory and a driving method for the same according to Embodiment 2 of the invention will now be described with reference to FIG. 3.

Figure 3:
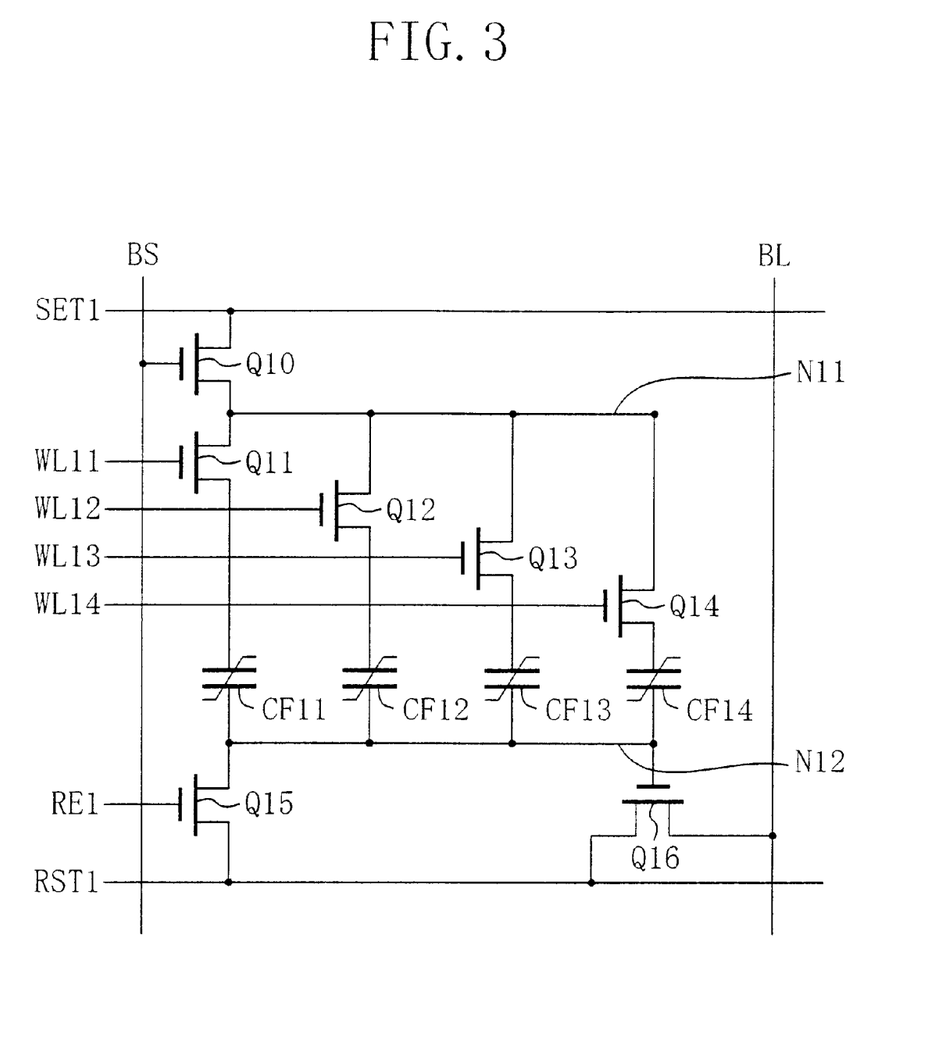
FIG. 3 is an equivalent circuit diagram of a first memory cell block included in a semiconductor memory according to Embodiment 2 of the invention.

FIG. 3 is an equivalent circuit diagram of a first memory cell block included in the semiconductor memory of Embodiment 2. A second memory cell block also has an equivalent circuit similar to that of the first memory cell block but is herein omitted.

As shown in FIG. 3, a plurality of ferroelectric capacitors CF11, CF12, CF13 and CF14 each for storing a data in accordance with displacement of polarization of a ferroelectric film thereof are respectively connected to a plurality of cell selecting transistors Q11, Q12, Q13 and Q14 in series, so that a plurality of memory cells each composed of each of the ferroelectric capacitors and a corresponding one of the cell selecting transistors can be connected to one another in parallel.

A first common node N11 is connected through a first block selecting transistor Q10 to a first set line SET1 to which a reading voltage is applied, and the gate electrode of the first block selecting transistor Q10 is connected to a block selecting line BS. A second common node N12 is connected to a first reset line RST1 through a first writing transistor Q15, and also to the gate electrode of a first reading transistor Q16 serving as a load capacitor. The gate electrode of the first writing transistor Q15 is connected to a first writing transistor control line RE1, the drain region of the first reading transistor Q16 is connected to a bit line BL and the source region of the first reading transistor Q16 is connected to the first reset line RST1.

The gate electrodes of the cell selecting transistors Q11, Q12, Q13 and Q14 are respectively connected to word lines WL11, WL12, WL13 and WL14.

As a characteristic of Embodiment 2, the cell selecting transistors Q11, Q12, Q13 and Q14 are disposed on the side of the first common node N11, and the ferroelectric capacitor CF11, CF12, CF13 and CF14 are disposed on the side of the second common node N12.

Also in Embodiment 2, the plural ferroelectric capacitors CF11, CF12, CF13 and CF14 have the same capacitance and the plural cell selecting transistors Q11, Q12, Q13 and Q14 have the same size.

A method for driving the semiconductor memory of Embodiment 2 is the same as the driving method described in Embodiment 1 and hence the description is omitted.

In the method for driving the semiconductor memory of Embodiment 2, the polarization of the ferroelectric film of the ferroelectric capacitor CF12 is not reversed in a read operation as in the driving method of Embodiment 1. Therefore, the polarization fatigue is minimally caused in the ferroelectric film of the ferroelectric capacitor CF12, resulting in largely improving the retention characteristic of the semiconductor memory.

Now, comparison between Embodiment 1 and Embodiment 2 will be described. The ferroelectric capacitors CF11, CF12, CF13 and CF14 are disposed on the side of the first common node N11 and the cell selecting transistors Q11, Q12, Q13 and Q14 are disposed on the side of the second common node N12 in Embodiment 1. Therefore, as compared with the case where the cell selecting transistors Q11, Q12, Q13 and Q14 are respectively disposed between the first common node N11 and the ferroelectric capacitors CF11, CF12, CF13 and CF14 as in Embodiment 2, time required for driving the memory can be shortened. Specifically, the gate-source capacitances of the cell selecting transistors Q11, Q13 and Q14 serially connected to the unselected ferroelectric capacitors CF11, CF13 and CF14 work as parasitic capacitance in Embodiment 1, but this parasitic capacitance is so negligibly small that a high operation speed can be attained. In contrast, large capacitances of the unselected ferroelectric capacitors CF11, CF13 and CF14 work as the parasitic capacitance, which disadvantageously elongates the time required for driving the memory.

Embodiment 3

A semiconductor memory and a driving method for the same according to Embodiment 3 of the invention will now be described with reference to FIG. 4.

Figure 4:
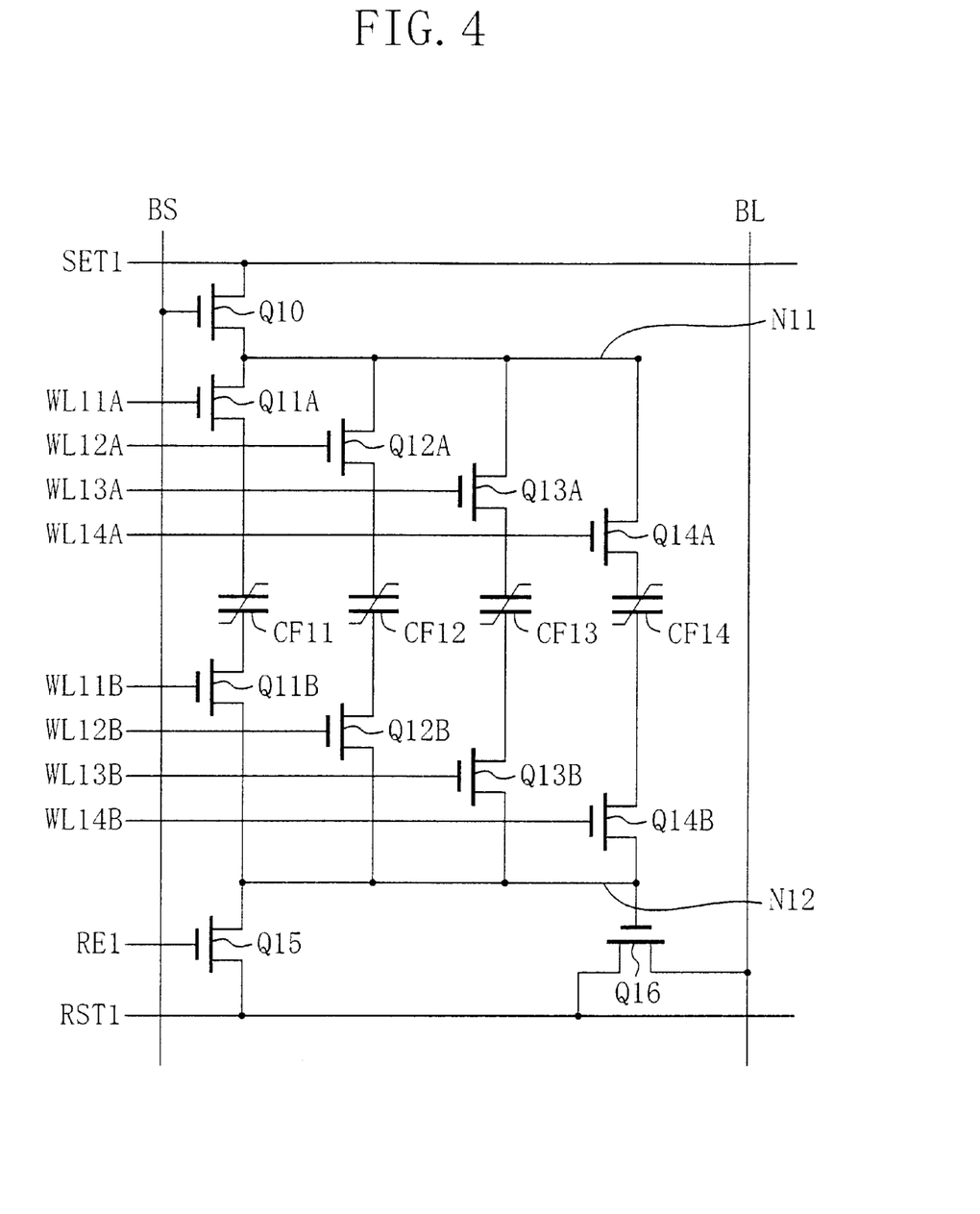
FIG. 4 is an equivalent circuit diagram of a first memory cell block included in a semiconductor memory according to Embodiment 3 of the invention.

FIG. 4 is an equivalent circuit diagram of a first memory cell block included in the semiconductor memory of Embodiment 3. A second memory cell block also has an equivalent circuit similar to that of the first memory cell block and is herein omitted.

As shown in FIG. 4, in the first memory cell block, a plurality of ferroelectric capacitors CF11, CF12, CF13 and CF14 each for storing a data in accordance with displacement of polarization of a ferroelectric film thereof are respectively connected, at their upper electrodes, to a plurality of first cell selecting transistors Q11A, Q12A, Q13A and Q14A and connected, at their lower electrodes, to a plurality of second cell selecting transistors Q11B, Q12B, Q13B and Q14B, so that a plurality of memory cells each composed of each of the ferroelectric capacitors, a corresponding one of the first cell selecting transistors and a corresponding one of the second cell selecting transistors can be connected to one another in parallel.

A first common node N11 is connected through a first block selecting transistor Q10 to a first set line SET1 to which a reading voltage is applied, and the gate electrode of the first block selecting transistor Q10 is connected to a block selecting line BS. A second common node N12 is connected to a first reset line RST1 through a first writing transistor Q15 and also to the gate electrode of a first reading transistor Q16 serving as a load capacitor. The gate electrode of the first writing transistor Q15 is connected to a first writing transistor control line RE1, the drain region of the first reading transistor Q16 is connected to a bit line BL and the source region of the first reading transistor Q16 is connected to the first reset line RST1.

The gate electrodes of the first cell selecting transistors Q11A, Q12A, Q13A and Q14A are respectively connected to first word lines WL11A, WL12A, WL13A and WL14A, and the gate electrodes of the second cell selecting transistors Q11B, Q12B, Q13B and Q14B are respectively connected to second word lines WL11B, WL12B, WL13B, and WL14B.

As a characteristic of Embodiment 3, the first cell selecting transistors Q11A, Q12A, Q13A and Q14A are respectively disposed between the ferroelectric capacitors CF11, CF12, CF13 and CF14 and the first common node N11, and the second cell selecting transistors Q11B, Q12B, Q13B and Q14B are respectively disposed between the ferroelectric capacitors CF11, CF12, CF13 and CF14 and the second common node N12.

In Embodiment 3, the plural ferroelectric capacitors CF11, CF12, CF13 and CF14 have the same capacitance, the plural first cell selecting transistors Q11A, Q12A, Q13A and Q14A have the same size, and the plural second cell selecting transistors Q11B, Q12B, Q13B and Q14B have the same size.

In conducting a data write operation or a data read operation in the memory cell block of the semiconductor memory of Embodiment 3, the first cell selecting transistor Q12A and the second cell selecting transistor Q12B serially connected to the ferroelectric capacitor CF12 included in the selected memory cell are turned on. Thus, the upper electrode of the selected ferroelectric capacitor CF12 is connected to the first set line SET1 through the first cell selecting transistor Q12A and the lower electrode of the selected ferroelectric capacitor CF12 is connected to the first reset line RST1 through the second cell selecting transistor Q12B. The first cell selecting transistors Q11A, Q13A and Q14A and the second cell selecting transistors Q11B, Q13B and Q14B serially connected to the ferroelectric capacitors CF11, CF13 and CF14 included in the unselected memory cells are turned off.

In Embodiment 1 or 2, a small voltage is applied between the upper electrode and the lower electrode of each of the unselected ferroelectric capacitors CF11, CF13 and CF14. In contrast, the unselected ferroelectric capacitors CF11, CF13 and CF14 are definitely disconnected from the first set line SET1 and the first reset line RST1 in Embodiment 3. Accordingly, no voltage is applied between the upper electrode and the lower electrode of each of the unselected ferroelectric capacitors CF11, CF13 and CF14.

Embodiment 4

A semiconductor memory and a driving method for the same according to Embodiment 4 of the invention will now be described with reference to FIG. 5.

Figure 5:
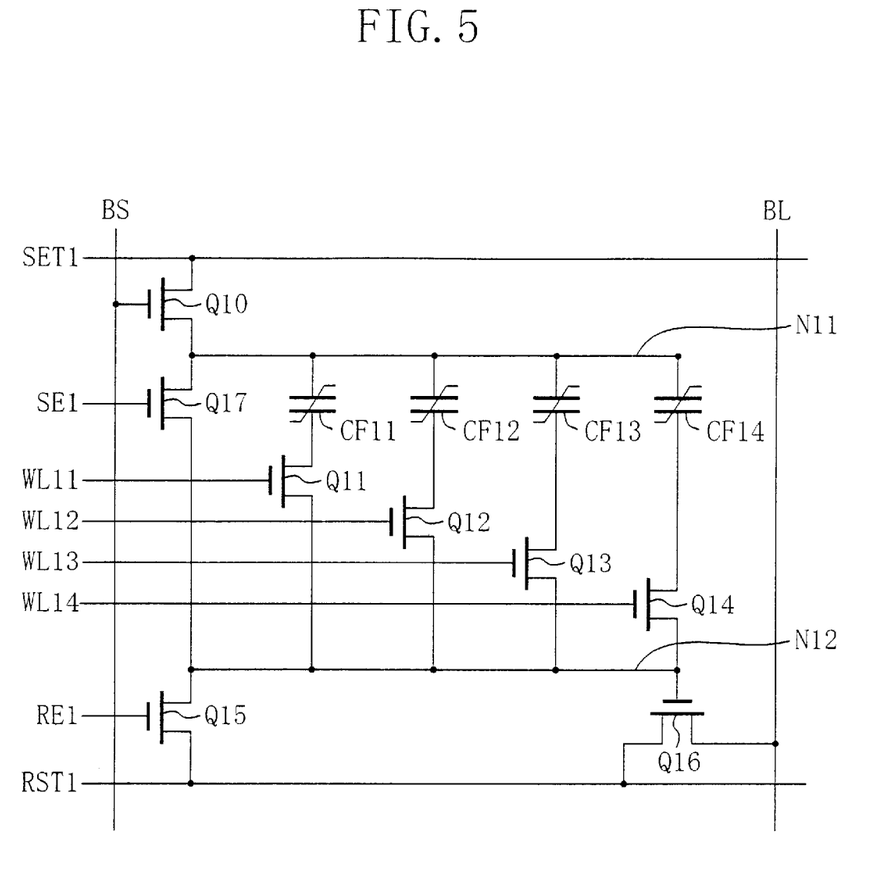
FIG. 5 is an equivalent circuit diagram of a first memory cell block included in a semiconductor memory according to Embodiment 4 of the invention.

FIG. 5 is an equivalent circuit diagram of a first memory cell block included in the semiconductor memory of Embodiment 4. A second memory cell block also has an equivalent circuit similar to that of the first memory cell block but is herein omitted.

As shown in FIG. 5, in the first memory cell block, a plurality of ferroelectric capacitors CF11, CF12, CF13 and CF14 each for storing a data in accordance with displacement of polarization of a ferroelectric film thereof are respectively connected to a plurality of cell selecting transistors Q11, Q12, Q13 and Q14 in series, so that a plurality of memory cells each composed of each of the ferroelectric capacitors and a corresponding one of the cell selecting transistors can be connected to one another in parallel.

A first common node N11 is connected through a first block selecting transistor Q10 to a first set line SET1 to which a reading voltage is applied, and the gate electrode of the first block selecting transistor Q10 is connected to a block selecting line BS. A second common node N12 is connected to a first reset line RST1 through a first writing transistor Q15 and also to the gate electrode of a first reading transistor Q16 serving as a load capacitor. The gate electrode of the first writing transistor Q15 is connected to a first writing transistor control line RE1, the drain region of the first reading transistor Q16 is connected to a bit line BL and the source region of the first reading transistor Q16 is connected to the first reset line RST1.

The gate electrodes of the cell selecting transistors Q11, Q12, Q13 and Q14 are respectively connected to word lines WL11, WL12, WL13 and WL14.

Also in Embodiment 4, the plural ferroelectric capacitors CF11, CF12, CF13 and CF14 have the same capacitance and the plural cell selecting transistors Q11, Q12, Q13 and Q14 have the same size.

As a characteristic of Embodiment 4, a reset transistor Q17 is connected between the first common node N11 and the second common node N12, and the gate electrode of the reset transistor Q17 is connected to a reset control line SE.

In Embodiment 4, after a data write operation and a data read operation, a high signal is applied to the reset control line SE so as to turn on the reset transistor Q17.

Accordingly, a potential difference caused between the upper electrode and the lower electrode of a ferroelectric capacitor can be definitely made zero in a short time after completing a data write operation and a data read operation.

In each of Embodiments 1 through 4, the first reading transistor Q16 is used as a load capacitor, and a voltage obtained by dividing the reading voltage in accordance with a ratio between the capacitance of the ferroelectric capacitor and the gate capacitance of the first reading transistor Q16 is applied to the gate electrode of the first reading transistor Q16, so that a data stored in the ferroelectric capacitor can be read by detecting a difference in the current flowing between the drain region and the source region of the first reading transistor Q16 in accordance with the gate potential. However, the first reading transistor Q16 may be replaced with another load capacitor. For example, the first reading transistor Q16 may be replaced with a line, so that a voltage obtained by dividing the reading voltage in accordance with a ratio between the capacitance of the ferroelectric capacitor and the line capacitance of the line can be applied to the line so as to be detected by a sense amplifier.

What is claimed is:

1. A method for driving a semiconductor memory,
    said semiconductor memory including a memory cell block composed of a plurality of memory cells connected to one another in parallel and each including a ferroelectric capacitor for storing a data in accordance with displacement of polarization of a ferroelectric film thereof and a cell selecting transistor connected to said ferroelectric capacitor in series; a set line connected to a first common node of two common nodes included in said memory cell block, a reading voltage being applied to said set line; and a load capacitor connected to a second common node of the two common nodes for detecting displacement of polarization of the ferroelectric film of a selected ferroelectric capacitor selected from a plurality of ferroelectric capacitors included in said plurality of memory cells, the method comprising:
    a first step of turning on one of said cell selecting transistors serially connected to said data read ferroelectric capacitor and turning off the other of said cell selecting transistors serially connected to ferroelectric capacitors from which a data is not to be read among said plurality of ferroelectric capacitors, whereby connecting a first electrode of said data read ferroelectric capacitor to said set line through said first common node and connecting a second electrode of said data read ferroelectric capacitor to said load capacitor through said second common node;
    a second step of applying a reading voltage to said set line; and
    a third step of removing said reading voltage applied to said set line,
    wherein said reading voltage applied in the second step is set to such magnitude that displacement of polarization of the ferroelectric film of said data read ferroelectric capacitor is restored to displacement obtained before reading a data by removing said reading voltage in the third step.

2. The method for driving a semiconductor memory of claim 1, further comprising, after the third step, a fourth step of making a potential difference caused between said first electrode and said second electrode of said data read ferroelectric capacitor zero.

3. The method for driving a semiconductor memory of claim 1,
    wherein said reading voltage applied in the second step is set to such magnitude that a potential difference caused, in applying said reading voltage, between said first electrode and said second electrode of said data read ferroelectric capacitor is smaller than a coercive voltage of said data read ferroelectric capacitor.

4. The method for driving a semiconductor memory of claim 1,
    wherein said plurality of ferroelectric capacitors are disposed on the side of said first common node and said plurality of cell selecting transistors are disposed on the side of said second common node.

5. The method for driving a semiconductor memory of claim 1,
    wherein said load capacitor is a field effect transistor whose gate electrode is connected to said second common node.

* * * * *